United States Patent [19]

VanBrunt

[11] Patent Number: 4,625,072
[45] Date of Patent: Nov. 25, 1986

[54] CABLE SHIELD TERMINATION MEANS

[75] Inventor: Michael K. VanBrunt, Playa del Rey, Calif.

[73] Assignee: G&H Technology, Inc., Greenwich, Conn.

[21] Appl. No.: 691,170

[22] Filed: Jan. 14, 1985

[51] Int. Cl.⁴ ............................................. H05K 9/00
[52] U.S. Cl. ............................. 174/35 R; 174/65 SS
[58] Field of Search ............ 174/35 R, 35 GC, 65 SS, 174/78, 89; 285/158, 161, 343

[56] References Cited

U.S. PATENT DOCUMENTS

| | | | |
|---|---|---|---|
| 3,110,756 | 11/1963 | Genung et al. | 174/89 |
| 3,116,361 | 12/1963 | Bentz et al. | 174/89 X |
| 3,485,517 | 12/1969 | Howe | 174/65 SS X |
| 3,739,076 | 6/1973 | Schwartz | 174/65 SS X |
| 3,784,730 | 1/1974 | Bannies | 285/161 X |
| 4,156,554 | 5/1979 | Aujla | 174/89 X |

FOREIGN PATENT DOCUMENTS

| | | | |
|---|---|---|---|
| 2309649 | 8/1974 | Fed. Rep. of Germany | 174/65 SS |
| 1037546 | 8/1958 | Netherlands | 174/89 |
| 993282 | 5/1965 | United Kingdom | 174/65 SS |

Primary Examiner—Arthur T. Grimley
Assistant Examiner—D. A. Tone
Attorney, Agent, or Firm—George J. Netter

[57] ABSTRACT

After removing a portion of the insulative covering from a cable leaving exposed the bare shield, a circumferential cut is made in the shield. A flanged, split-ring cylindrical metal contact is located underneath the braid with the flange extending through the cut. Shrink tape applied over the exposed shield serves to hold this shield and portions of the underlying contact together. A receiver tube located on the cable has an internal shoulder which fits against the contact flange and a gland nut threaded into the open end of the receiver tube has an internal end pressing against the contact flange to force it into contact with the receiver tube internal shoulder.

6 Claims, 3 Drawing Figures

CABLE SHIELD TERMINATION MEANS

FIELD OF THE INVENTION

The present invention relates, generally, to a shielded cable and, more particularly, to means for terminating the cable shield to a ground plate through which the cable passes.

BACKGROUND OF THE INVENTION

There are many situations in which a cable passes from one environment where an extensive electromagnetic interference field exists through a shielding wall into a second environment to interconnect with equipment that could be easily damaged or made inoperative by induced interference signals. Accordingly, it is highly desirable in such situations to effect grounding or termination of the cable shield at the enclosing shielding wall which would be effective to ground any interference signals induced into the cable shield by interfering electromagnetic fields in the first environment and thereby prevent access of such potentially damaging signals to the equipment in the shielded environment.

For example, on board ship an intense interference field is produced by the ship's radar which can produce an interference signal of sufficient magnitude to completely disrupt and even, perhaps, destroy equipment handling low level signals.

A common approach to grounding a cable shield in the past has been to use a one-point connector ("pig tail") which although removing a certain amount of induced signals may not be sufficiently effective to remove enough of the interference signals to fully protect equipment connected to the cable wires.

Another approach to solving this problem is disclosed in copending U.S. patent application Ser. No. 642,170 filed Aug. 20, 1984, CABLE SHIELD GROUNDING APPARATUS by M. K. Van Brunt and G. E. Walters, which application is assigned to the same assignee as the present application. As shown there, a band of outer insulation is removed from the cable leaving a bare ring of cable shield exposed. A bandlike leaf spring having a plurality of radially inwardly directed edges is received about the bare shield with the edges contacting the shield. A hollow cylindrical member is received on the cable with its internal walls pressing the leaf spring tightly against the shield. A cap is threaded onto the cylindrical member, and the cylindrical member is received within an opening in a ground plane and welded to the ground plane immediately adjacent the opening.

A U.S. patent application assigned to this same assignee, Ser. No. 540,127 filed Oct. 7, 1983 now U.S. Pat. No. 4,547,623, CABLE SHIELD GROUNDING APPARATUS by M. K. Van Brunt and P. Madle locates one or more first conductive rings in contact with a base shield portion on the cable. A metal split-cylinder is disposed over the first conductive rings pressing them against the shield. A second metal ring and a rubber O-ring securely holds it in place. A cylindrical part received on the cable has an internal bore of such dimensions as to make flush contact with the second metal ring. A cap assembly encloses the cylindrical part, the latter being welded to the sides of an opening in a grounding plane.

SUMMARY OF THE DISCLOSURE

A portion of an insulative outer protective covering is removed from the cable leaving exposed a bare shield portion. A circumferentially extending cut is made in the cable shield and a cylindrical metal contact with a circumferentially extending flange is located underneath the braid with the flange extending through the cut. The contact is a split-ring contruction enabling mounting in this way. A shrink tape is applied over the exposed shield serving to hold this shield and portions of the underlying contact into intimate contacting relationship. A receiver tube located on the cable has an internal shoulder which fits against the contact flange. A gland nut threaded into the open end of the receiver tube has an internal end pressing against the contact flange to force it into contact with the receiver tube internal shoulder.

A heat shrink boot is disposed over the gland nut and immediately adjacent end portion of the receiver tube to prevent access of dirt, dust or other foreign materials. The external dimensions of the receiver tube are such as to enable receipt through an opening in a ground plane or wall to which it can be secured as by welding, for example.

DESCRIPTION OF A PREFERRED EMBODIMENT

Figure 1:
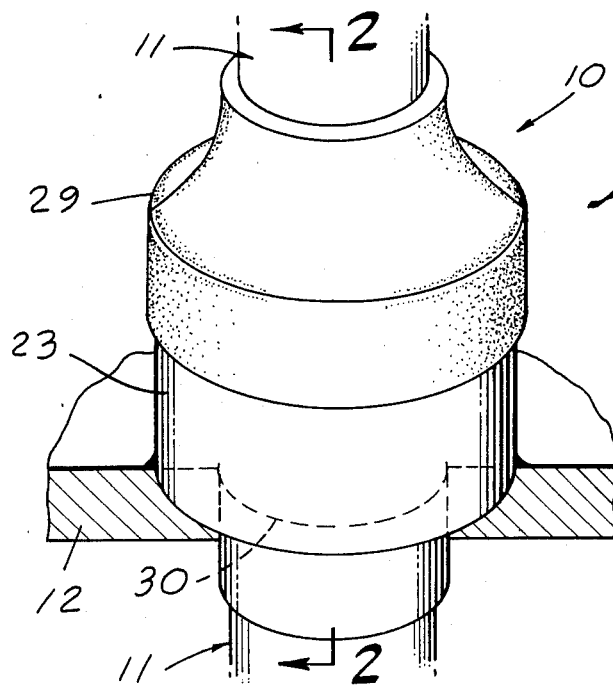
FIG. 1 is a perspective view of the cable shield termination means of this invention shown mounted on a cable and effecting termination to a wall.
Figure 3:
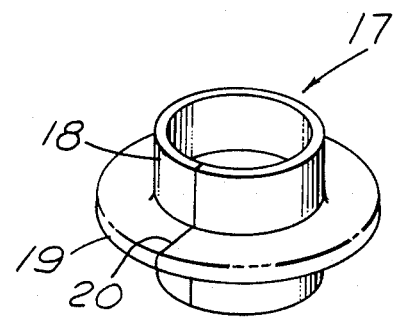
FIG. 3 is a perspective view of a flanged contact for use in the present invention.

As can be seen best in FIG. 1, the termination and grounding means of the present invention, identified generally as at 10, completely encompasses the cable and, in a way that will be described in detail, effects continuous circumferential contact between the cable shield and a grounding plane 12 such as the deck of a ship, for example.

Figure 2:
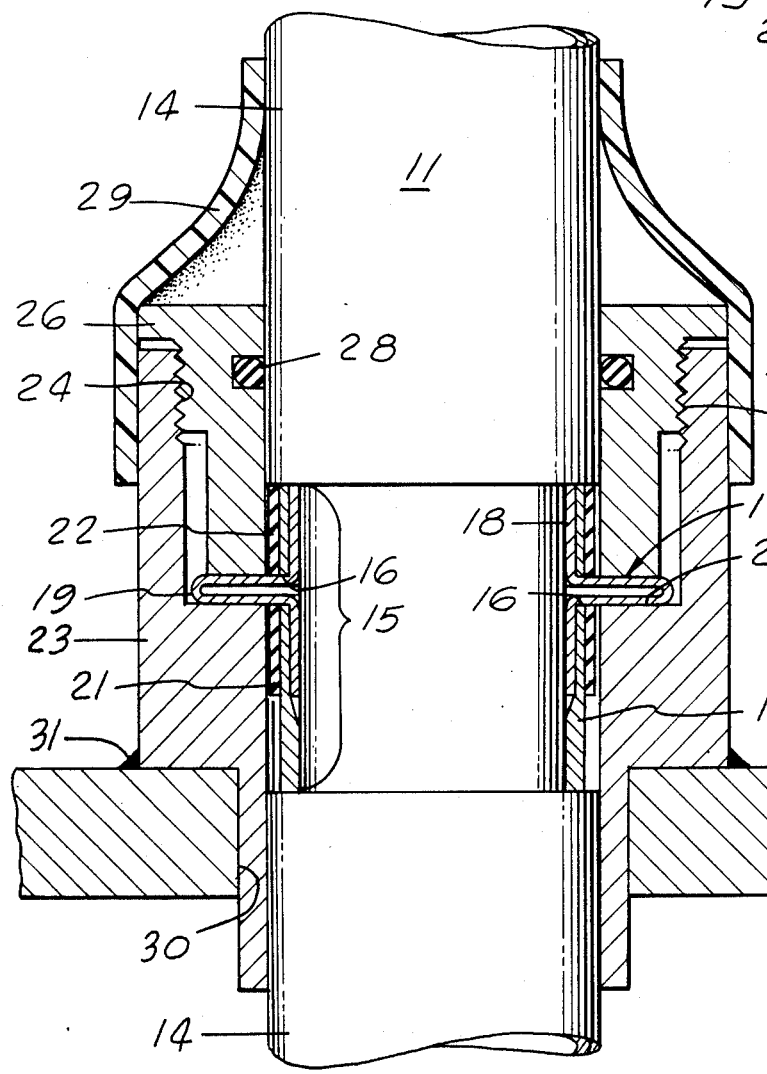
FIG. 2 is a side elevational sectional view taken along the lines 2—2 of FIG. 1.

Turning to FIG. 2, the cable 11 is seen to consist of a central part which may include one or more cable wires and each of which can optionally be separately enclosed within their own shields or typically merely consist of cable wires having an insulative covering thereover. The entire cable is enclosed within a single shield 13 constructed of a metal braid, for example, and over which a protective insulative covering 14 is molded or otherwise formed. As an initial step preparatory to use and assembly of the termination means 10, a portion of the cable outer protective covering 14 is removed leaving a band 15 of exposed cable shield 13. In addition, at substantially, the midpoint of the exposed band 15, a circumferential slit 16 is made in the shield 13.

A contact 17 has a generally cylindrical body 18 with an inner bore closely matching the diameter of the cable 11 as measured underneath the shield 13. In making the contact 17, a central portion is formed to extend radially outwardly from the tube 18 as a doublewall flange 19. The contact 17 is constructed of a good electrical conducting material such as copper, for example.

A longitudinally extending slit 20 in the contact 17 enables mounting of the contact onto the cable in a way that will be described. In mounting the contact 17 onto the cable, first the shield 13 is peeled back away from the slit 16, then the tube 18 is clamped about the cable underneath the shield 13, and finally the shield is folded back onto the outer surface of the tube 18 leaving the flange 19 extending outwardly beyond the cable outer surface (FIG. 2). Preferably, solder can be applied to the contacting surfaces of the tube 18 and the directedly opposed shield so as to effect a continuous mechanical and electrical connection between them. Lastly, first and second strips of heat shrink tape 21 and 22 are applied over the bare shield 13 immediately adjacent the contact flange 19, one at each side of the flange.

A metal receiver tube 23 has one open end containing internal threads as at 24 and an internal circular shoulder 25 of such dimensions as to enable receipt onto cable 11 with the contact flange 19 resting on the shoulder. A gland nut 26 has a bore permitting receipt over the entire cable and includes threads 27 for meshing with the threads 24 on the receiver tube. When the gland nut is threaded within receiver tube 23 its inner end surface bears against the contact flange 19 establishing a firm physical and electrical contact between the contact, the cable shield and the receiver tube.

O-ring 28 located within a recess formed on the inner wall of gland nut 26 seals the nut to the cable excluding dirt, dust and moisture. A shrink tube 29 about the end of the tube 23, gland nut 26 and adjacent parts of the cable is further insurance against external foreign matter entering the termination means.

After assembly of the termination means 10 onto a cable as described, the outer end of the tube 23 which is of reduced diameter passes through an opening 30 in ground plane 12 and is mechanically and electrically secured to 12 by weldment 31. The weldment preferably encircles the tube 23 in a closed path preventing leakage of interfering magnetic fields therepast.

What is claimed is:

1. Apparatus for electrically terminating the shield of a shielded cable to panel wall edge portions defining an opening through which the cable passes, comprising:

conductive tubular contact means including a radially extending flange located intermediate the contact means ends such that first and second portions of the contact means extend away from the flange in respectively opposite directions, said contact means having an internal bore permitting receipt onto the cable in contacting relationship with the cable shield;

receiver tube means having a bore sufficient to receive the cable therethrough, said tube means having an internal shoulder against which one side of the contact means flange abuts with the contact means first portion being received within the receiver tube means bore; and nut means threaded onto the receiver tube means and having a bore and a portion of the nut means which abuts against the other side of the contact means flange, the contact means second portion being received within the nut means bore.

2. Apparatus as in claim 1, in which the receiver tube has a first outer diameter portion larger than the panel wall opening and a second outer diameter portion smaller than said panel wall opening, said two diameter portions being separated by a shoulder.

3. Apparatus as in claim: 1, in which a resilient seal is located within a groove on the internal surface of the nut means for establishing a seal between the nut means and the cable.

4. Apparatus as in claim 1, in which a heat shrink tube is received over and end portion of the receiver tube.

5. Apparatus as in claim 1, in which the contact means is constructed of flexible metal and includes a longitudinally extending split line via which the contact means may be mounted onto the cable.

6. Apparatus as in claim 1, in which the contact means is so dimensioned as to enable fitting receipt under the cable shield through a circumferential opening therein.

* * * * *